(12) United States Patent
Hozoji et al.

(10) Patent No.: US 10,559,509 B2
(45) Date of Patent: Feb. 11, 2020

(54) INSULATING SUBSTRATE AND SEMICONDUCTOR DEVICE USING SAME

(71) Applicant: HITACHI METALS, LTD., Tokyo (JP)

(72) Inventors: Hiroshi Hozoji, Tokyo (JP); Kenji Hayashi, Tokyo (JP); Hiroyuki Itoh, Tokyo (JP); Hisayuki Imamura, Tokyo (JP); Hiroyuki Nagatomo, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 16/099,457

(22) PCT Filed: Aug. 9, 2017

(86) PCT No.: PCT/JP2017/028889
§ 371 (c)(1),
(2) Date: Nov. 7, 2018

(87) PCT Pub. No.: WO2018/043076
PCT Pub. Date: Mar. 8, 2018

(65) Prior Publication Data
US 2019/0221489 A1    Jul. 18, 2019

(30) Foreign Application Priority Data

Sep. 1, 2016  (JP) ................. 2016-171196

(51) Int. Cl.
*H01L 23/14* (2006.01)
*H02M 7/48* (2007.01)
(Continued)

(52) U.S. Cl.
CPC ............ *H01L 23/147* (2013.01); *H01L 23/12* (2013.01); *H01L 23/15* (2013.01); *H01L 25/00* (2013.01);
(Continued)

(58) Field of Classification Search
CPC ....... H01L 23/147; H01L 23/12; H01L 23/15; H01L 25/00; H01L 25/07; H01L 25/074; H01L 25/18; H02M 7/48; H05K 1/16
See application file for complete search history.

(56) References Cited

U.S. PATENT DOCUMENTS

2013/0182397 A1    7/2013  Abe et al.

FOREIGN PATENT DOCUMENTS

JP    04-072650 U    6/1992
JP    11-317495 A    11/1999
(Continued)

OTHER PUBLICATIONS

International Search Report, PCT/JP2017/028889, dated Oct. 3, 2017, 2 pgs.
(Continued)

*Primary Examiner* — Matthew L Reames
(74) *Attorney, Agent, or Firm* — Volpe and Koenig, P.C.

(57) ABSTRACT

In order to address the problem in that, by increasing the gate resistance of a power semiconductor element, while variation of switching time can be controlled, loss due to the gate resistance becomes larger and power efficiency for the entire system is lowered, the present invention provides an insulating substrate capable of uniformizing switching speeds of circuit elements while suppressing influence on power efficiency of the circuit elements. In the insulating substrate according to the present invention, part of a wiring layer is formed as a control signal circuit layer, and part of the control signal circuit layer is formed as a resistance layer that increases input resistance when the circuit element receives a control signal.

11 Claims, 4 Drawing Sheets

(51) Int. Cl.
    *H05K 1/16*          (2006.01)
    *H01L 23/12*        (2006.01)
    *H01L 25/18*        (2006.01)
    *H01L 25/00*        (2006.01)
    *H01L 25/07*        (2006.01)
    *H01L 23/15*        (2006.01)

(52) U.S. Cl.
    CPC ............ *H01L 25/07* (2013.01); *H01L 25/074* (2013.01); *H01L 25/18* (2013.01); *H02M 7/48* (2013.01); *H05K 1/16* (2013.01)

(56) References Cited

FOREIGN PATENT DOCUMENTS

| | | |
|---|---|---|
| JP | 2000-171491 A | 6/2000 |
| JP | 2007-317904 A | 12/2007 |
| JP | 2012-033664 A | 2/2012 |
| JP | 2012-084621 A | 4/2012 |

OTHER PUBLICATIONS

Written Opinion of the International Searching Authority dated Oct. 3, 2017 for the PCT International Application No. PCT/JP2017/028889 (with English concise explanation of the relevance provided for JP 04-072650 on p. 4).

INSULATING SUBSTRATE AND SEMICONDUCTOR DEVICE USING SAME

TECHNICAL FIELD

The present disclosure relates to an insulating substrate.

BACKGROUND ART

Power semiconductor elements such as IGBT (Insulated Gate Bipolar Transistor), power MOSFET transistor (Metal Oxide Semiconductor Field Effect Transistor), or MOSGTO (MOS Gate Turn-off Thyristor) are commonly known. These power semiconductor elements control electric power by inputting a signal for controlling the element into a gate to turn on/off the element.

The gate of power semiconductor element is connected with a wire formed on an insulating substrate. A control signal is inputted into the gate via the wire. If a plurality of power semiconductor elements is connected with the wire in parallel, it is typically assumed that those power semiconductor elements will be simultaneously turned on/off. However, if a switching speed of any one of those power semiconductor elements is different from that of others, the electric current is concentrated on a semiconductor element that turns on prior to other elements, or on a semiconductor element that delays in switching to off-state. Then the lifespan of such element will be more likely to be decreased, or such element will be more likely to be broken.

The switching time of semiconductor element is increased if the gate resistance is increased, and the switching time of semiconductor element is decreased if the gate resistance is decreased. Therefore, by increasing the gate resistance, it is possible to adjust the switching speed so that the difference in on/off timing between elements will be decreased. In some cases, in addition to the gate resistance of semiconductor element, a gate resistance component which is formed as a chip component is provided between the wire and the gate terminal, so that the switching times of each semiconductor element do not significantly vary due to variation in gate resistance within the semiconductor element.

Patent Literature 1 listed below describes a technique for adjusting gate resistance. In Patent Literature 1, a part of terminal connected to a gate electrode is formed with a material which has large specific resistance, and a sectional area size of that part or a length of that part is adjusted, thereby adjusting the gate resistance. Patent Literature 2 listed below describes a configuration example where a stack structure is formed on a sintered substrate, on which a glass powder paste and a metal paste are sintered.

CITATION LIST

Patent Literature

PTL 1: JP Patent Publication 2012-084621 A
PTL 2: JP Patent Publication 2012-033664 A

SUMMARY OF INVENTION

Technical Problem

In the technique described in Patent Literature 1, it is possible to adjust the variation in switching time by increasing the gate resistance of power semiconductor element. On the other hand, the loss due to the gate resistance is also increased, which causes a problem where overall electric power efficiency of the system is decreased.

The present disclosure is made in the light of the technical problem above. It is an objective of the present disclosure to provide an insulating substrate that is capable of suppressing an effect of circuit element (such as power semiconductor element) on electric power efficiency, while aligning switching speeds between circuit elements.

Solution to Problem

In an insulating substrate according to this disclosure, a part of a wire layer is formed as a control signal circuit layer, and a part of the control signal circuit layer is formed as a resistance layer that increases an input resistance when a circuit element receives a control signal.

An insulating substrate according to this disclosure comprises: a heat dissipation layer;

a wire layer on which a wire is formed, the wire being connected with a first and a second circuit elements; and an insulating layer that electrically insulates between the wire layer and the heat dissipation layer, wherein a part of the wire layer is formed as a control signal circuit layer that propagates a control signal to the first and the second circuit elements, and wherein a part of the control signal circuit layer is formed as a resistance layer that increases an input resistance when the first and the second circuit elements receive the control signal.

The resistance layer may be formed, as a part of a signal wire forming a signal propagation path for the control signal circuit layer, integrally with the signal wire.

The control signal circuit layer may be formed with a material including silicon oxide, and the resistance layer may be formed with a material including metal oxide.

The control signal circuit layer may be formed with a material including ceramics, and the resistance layer may be formed with a material including metal oxide.

A difference between an input resistance of the first circuit element and an input resistance of the second circuit element may be smaller than a difference between resistances of portions of signal wires forming a signal propagation path of the control signal circuit layer excluding the resistance layer.

The resistance layer may have a resistance that causes the input resistance of the first circuit element being same as the input resistance of the second circuit element.

At least one of the first circuit element or the second circuit element may have an electric power terminal that outputs electric power, and a coil may be formed at a part of the wire layer, the coil being disposed to surround the electric power terminal.

A signal wire that propagates the control signal may be formed inside the control signal circuit layer, and the signal wire may be formed at a portion that overlaps with the first and the second circuit elements along a stacking direction of the heat dissipation layer, of the insulating layer, and of the wire layer.

The first and the second circuit elements may be electrically connected with the control signal circuit layer in parallel to each other.

The insulating layer may be formed with a ceramics material.

A semiconductor device according to this disclosure comprises the first and the second circuit elements formed on the insulating substrate, wherein the first and the second circuit elements are configured as semiconductor elements.

Advantageous Effects of Invention

With the insulating substrate according to this disclosure, it is possible to suppress a decrease in electric power efficiency due to increased gate resistance, while aligning switching speeds between circuit elements.

DESCRIPTION OF EMBODIMENTS

<Regarding Conventional Insulating Substrates>

Hereinafter, for the sake of readily understanding this disclosure, a configuration of conventional insulating substrate and its technical problem will be described firstly. Then a configuration of insulating substrate according to this disclosure will be described.

Figure 1:
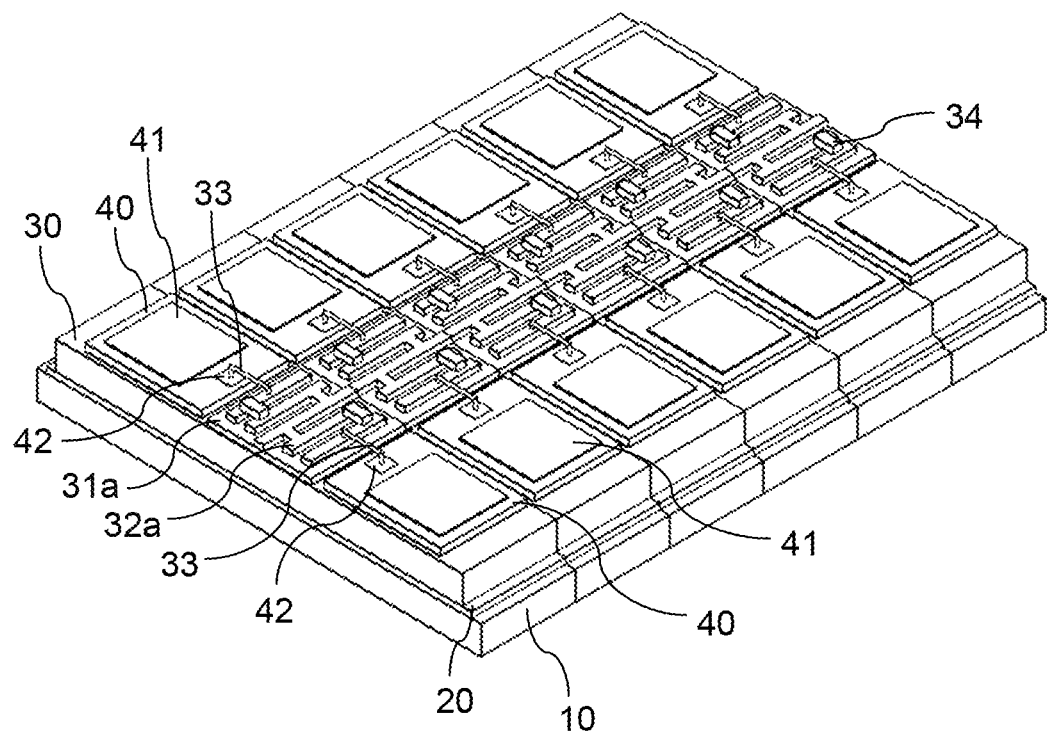
FIG. 1 is a perspective view illustrating a configuration of a conventional insulating substrate.

FIG. 1 is a perspective view illustrating a configuration of a conventional insulating substrate. The insulating substrate is an insulating substrate that equips a semiconductor element 40. The semiconductor element 40 is, for example, a semiconductor element that converts electric power. The semiconductor element 40 may be controlled by inputting a control signal via a gate terminal 42. The terminal 41 is a terminal that outputs electric power.

The insulating substrate includes a heat dissipation layer 10, an insulating layer 20, and a wire layer 30. A control signal input circuit 31a is formed on the wire layer 30. The control signal input circuit 31a includes a wire 32a. A control signal is inputted to the gate terminal 42 via the wire 32a and a bonding wire 33. Each of the semiconductor elements 40 is connected with the control signal input circuit 31a in parallel to each other.

The control signal input circuit 31a may further include a resistor 34 on the wire 32a, so as to align switching speeds between each of the semiconductor elements 40. The resistor 34 is, for example, a chip-like independent electric component.

If the resistor 34 is a chip component that is provided as a finished product, it is difficult to individually refine resistances of each of resistors 34. Then a resistor that has a large resistance may be selected as the resistor 34 in some cases, so as to suppress a difference of switching speeds between each of the semiconductor elements 40 below ignorable level. This is because a large resistance decreases switching speed, thereby suppressing the difference of switching speeds within a range that can be relatively ignored.

In such cases, however, there arises a technical problem that an overall electric power efficiency of the system including the semiconductor elements 40 is decreased. In addition, it is necessary to keep an implementation area size for providing chip components. It restricts the overall size of the insulating substrate 1. In addition, when such implementation area size is assured, the wire 32a is elongated and thus its resistance is increased further.

Instead of using the chip-like resistor 34, a part of the gate terminal may be formed with a material that has a large specific resistance, and length or width of the material portion may be adjusted, thereby adjusting the resistance. In such cases, it is necessary for increasing the resistance to elongate the resistance portion or to narrow the width. If the gate length itself is elongated, the overall size of the insulating substrate is also increased. Then it is necessary to bend the terminals into spiral form, for example, thereby suppressing the gate terminal length. In addition, it is not desirable to narrow the gate terminal width because narrowing the gate terminal width may decrease rigidity of the terminal and reliability of gate terminal or of the connection portion may be decreased due to thermal loads. Further, in order to finely control switching of the semiconductor element 40, it is necessary to increase the switching frequency. However, increasing the terminal length or decreasing the terminal width may cause increase in inductance of wires, which renders it difficult to finely control the semiconductor element 40 at high frequency.

In the light of above, this disclosure attempts to suppress an implementation area size of the resistance portion provided at outside of semiconductor element, by forming the resistance for adjusting switching speed integrally with the wire. In addition, this disclosure attempts to process the resistance layer after formed to finely adjust the resistance, by forming the resistance layer as a part of the wire.

Embodiment 1

Figure 2:
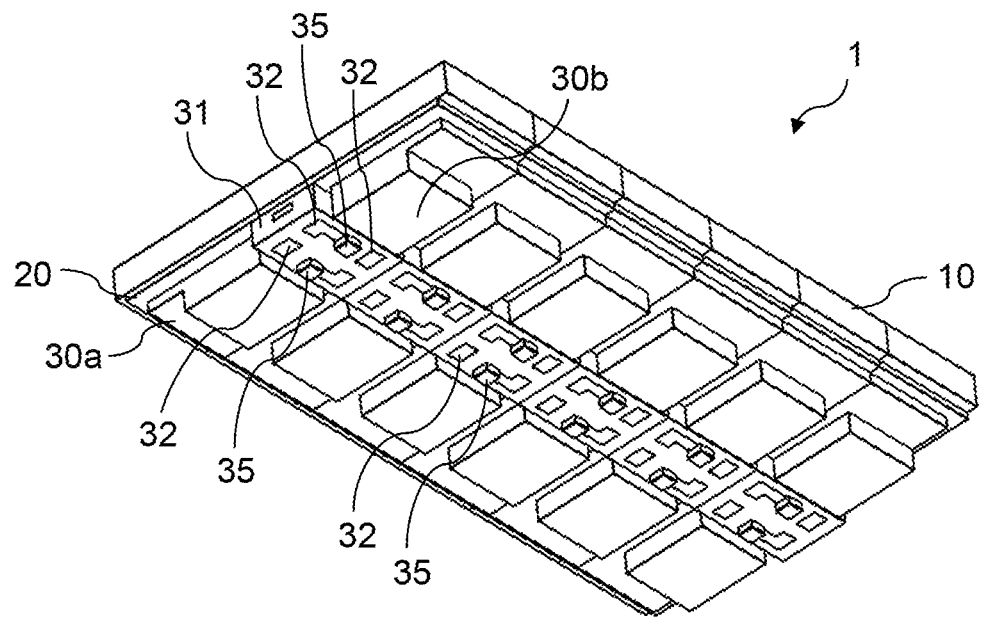
FIG. 2 is a perspective view illustrating a configuration of an insulating substrate 1 according to an embodiment 1.

FIG. 2 is a perspective view illustrating a configuration of an insulating substrate 1 according to an embodiment 1. The heat dissipation layer 10 is formed at a surface of the insulating layer 20, and the wire layers 30a and 30b are formed at another surface of the insulating layer 20. The insulating layer 20 has a role for electrically insulating between the heat dissipation layer 10 and the wire layers 30a, 30b. A part of the wire layers 30a and 30b is formed as a control signal input circuit 31. The control signal input circuit 31 includes a wire 32 and a connection terminal 35. The connection terminal 35 is a terminal for connecting the wire 32 with the semiconductor element 40 (refer to FIG. 4). The insulating layer 20 may be formed using ceramics materials such as $Al_2O_3$, AlN, or $Si_3N_4$, for example.

Figure 3:
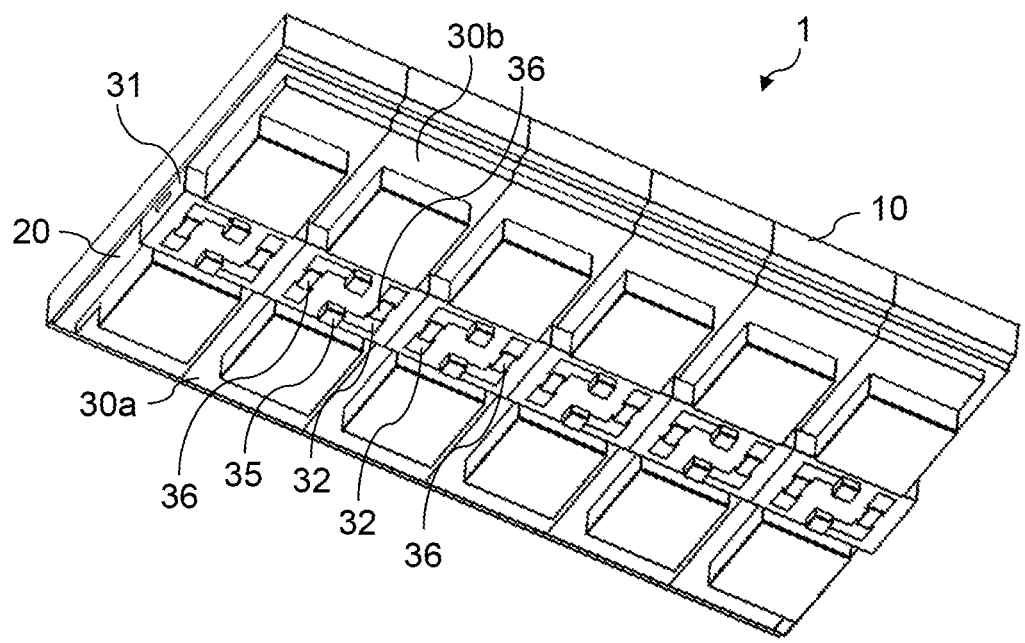
FIG. 3 is a perspective view illustrating an internal structure of a control signal input circuit 31.

FIG. 3 is a perspective view illustrating an internal structure of the control signal input circuit 31. A part of the wire 32 is formed as a resistance layer 36. By adjusting a resistance of the resistance layer 36 so that resistances (input resistance with respect to gate electrode) between a circuit that outputs a control signal to the control signal input circuit 31 and the gate electrodes of each of the semiconductor elements 40 are same with each other, it is possible to align the switching speeds between each of the semiconductor elements 40. A gate terminal 42 is a terminal that connects the gate electrode in the semiconductor element 40 with outside of the element. The resistance between the gate electrode and the gate terminal 42 is sufficiently small, and thus may be ignored.

When forming the control signal input circuit 31: a paste including glass powder is placed on the insulating layer 20; a metal paste (e.g. a paste in which Cu or Ag is mixed with glass powders) is printed on the glass powder paste for forming the wire 32; a metal oxide paste (e.g. a paste including $RuO_2$ and glass powder) is printed on the metal paste for forming the resistance layer 36. Then the insulating layer 20/the glass powder paste/the metal paste/the metal oxide paste are collectively sintered. Accordingly, it is possible to integrally form the insulating layer 20 and the control signal input circuit 31.

In the process for sintering the insulating layer 20 and the control signal input circuit 31, the glass powder/the metal (the wire 32)/the metal oxide (the resistance layer 36) forming the control signal input circuit 31 are also integrally formed. Accordingly, the resistance layer 36 is integrally formed with the wire 32 as a part of the wire 32. Therefore, it is not necessary to additionally provide a resistor configured as a chip component.

When finely adjust the resistance of the resistance layer 36, the control signal input circuit 31 is firstly formed without covering the resistance layer 36, as shown in FIG. 3. Then by adjusting length of the resistance layer 36 or width of the resistance layer 36 using such as laser processing, it is possible to finely adjust the resistance. If the wire 32 or the resistance 36 is to be covered, it is possible to cover the wire 32 and the resistance layer 36 as shown in FIG. 2, by placing glass powder pastes on the substrate after finely adjusted and by sintering the substrate again.

A desirable material of the glass powder is a material that can be stacked on a ceramics substrate for forming the insulating layer 20 and then can be sintered. Examples of such material may be those that contain silicon oxide, such as (a) a glass powder that contains $SiO_2$, $B_2O_3$, and alkali metal oxide, (b) a glass powder that contains $SiO_2$, $B_2O_3$, $Al_2O_3$, and alkaline earth metal oxide, (c) a glass powder that contains $SiO_2$, $B_2O_3$, and alkali earth metal oxide, (d) a glass powder that contains $SiO_2$, $B_2O_3$, $ZrO_2$, and alkali metal oxide, (e) a glass powder that contains $SiO_2$, alkali metal oxide, and alkali earth metal oxide.

Figure 4:
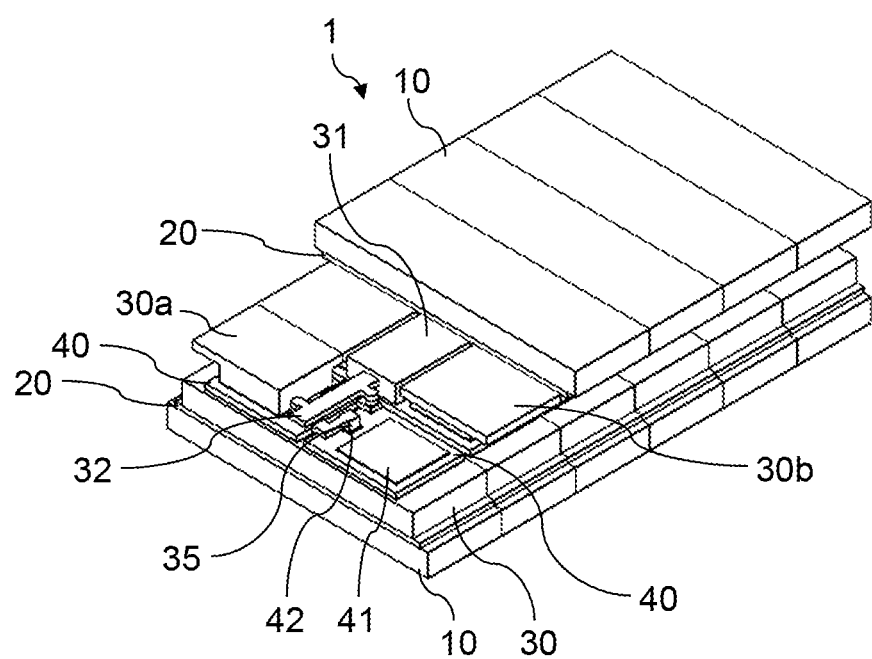
FIG. 4 is an internal view illustrating a state where a semiconductor element 40 is implemented on the insulating substrate 1.

FIG. 4 is an internal view illustrating a state where the semiconductor element 40 is implemented on the insulating substrate 1. For the sake of explanation, the figure shows a state where parts of components are removed so that the internal structure can be seen. This example shows an implementation where a stack structure of the heat dissipation layer 10/the insulating layer 20/the wire layers 30a and 30b shown in FIGS. 2-3 (including the component 31) is overlapped with a stack structure of the heat dissipation layer 10/the insulating layer 20/the wire layer 30 (without the component 31, including the semiconductor element 40).

The wire 32 is connected with the gate terminal 42 via the connection terminal 35. A layer, which is formed by sintering glass powders, is formed around the wire 32, thereby the control signal input circuit 31 is formed as a layer forming a part of the wire layers 30a and 30b. The glass portion around the wire 32 has a role to insulate the wire 32 from the wire layers (30a, 30b) at both sides of the wire 32. The terminal 41 is electrically connected with the wire layers 30a and 30b. The terminal 41 outputs electric power via the wire layers 30a and 30b.

The wire 32 is formed overlapping with two adjacent semiconductor elements 40 in the stacking direction of the insulating substrate 1. In other words, the wire 32 is arranged crossing the opposing sides of two adjacent semiconductor elements 40. Accordingly, comparing to the structure where the control signal input circuit 31 is disposed between two semiconductor elements 40 as shown in FIG. 1, the two semiconductor elements in FIG. 4 are disposed closer to each other. Therefore, the length of the wire 32 can be shorter than that of FIG. 1. Thus the overall size of the insulating substrate 1 can be smaller and the electric resistance of the wire 32 can be suppressed.

An bonding agent for connecting between the gate terminal 42 and the connection terminal 35 and for connecting between the terminal 41 and the wire layers 30a, 30b may be such as: (a) solders using such as Sn, Ag, Cu, In, Sb, or Pb; (b) bonding materials using nano-size particles of such as Ag, Cu, Au, or Ni; (c) oxides of Ag particles, Cu particles, or Ni particles in sub-micron size.

The control signal input circuit may be formed using a material including ceramics powders. For example, in the configuration of the embodiment 1, alumina powders may be used instead of glass powders. However, it is more desirable to use glass powder pastes and metal pastes as in the embodiment 1, because it is possible to form the control signal circuit layer by simultaneously performing the sintering process to stably form the circuit layer.

Comparing to the difference of resistance between signal wires (excluding the resistance layer) forming the signal propagation path of the control signal circuit layer, it is more beneficial if the difference between input resistances of the circuit element is as small as possible. For example, it is better if the difference between an input resistance of a first one of the semiconductor element 40 and an input resistance of a second one of the semiconductor element 40 is as smaller as possible than a difference between a resistance of signal wire connected with the first one of the semiconductor element 40 and a resistance of signal wire of the second one of the semiconductor element 40. Accordingly, in the embodiment 1, the resistance of the resistance layer 36 is adjusted so that resistances between a circuit outputting a control signal to the control signal input circuit 31 and the gate electrodes of each of the semiconductor elements 40 are approximately same with each other.

Embodiment 1: Summary

In the insulating substrate 1 according to the embodiment 1, the resistance layer 36 is formed integrally with the signal propagation path as a part of the wire 32. The specific resistance of the resistance layer 36 formed with metal oxides is sufficiently large, and the resistance for adjusting the switching speed of the semiconductor element 40 can be implemented with small size. Thus it is possible to suppress increase in size of the insulating substrate 1.

In the insulating substrate 1 according to the embodiment 1, it is not necessary for increasing the resistance of the resistance layer 36 to increase the wire length or to narrow the wire width. Therefore, it is possible to configure the resistance of the resistance layer 36 at a desired value without unnecessarily increasing the wire inductance to impair the control accuracy.

Embodiment 2

Figure 5:
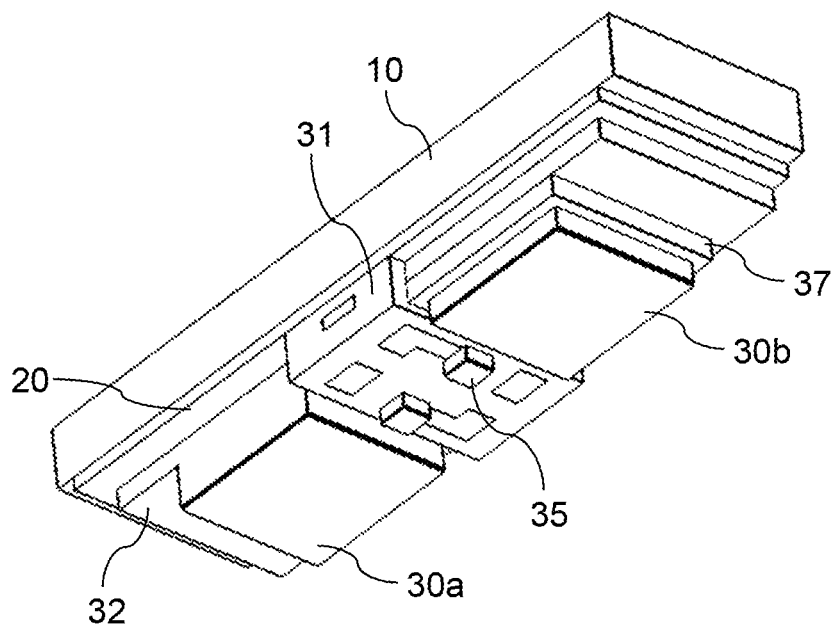
FIG. 5 is a schematic perspective view illustrating a part of the insulating substrate 1 according to an embodiment 2.

FIG. 5 is a schematic perspective view illustrating a part of the insulating substrate 1 according to an embodiment 2 of this disclosure. In the embodiment 2, a coil 37 is formed inside the wire layer 30b for measuring an electric current passing through the wire layer 30b. The coil 37 is formed as a wire surrounding the terminal 41 while keeping the insulation. The coil 37 may be formed by a process similar to that for forming the control signal input circuit 31.

When an electric current flows through the terminal 41, another electric current is induced in the coil 37. The coil 37 is connected with the control signal input circuit 31. By acquiring the electric current flowing in the coil 37 via the control signal input circuit 31, it is possible to measure the electric current flowing in the terminal 41. Since the coil 37 is arranged near the terminal 41, which is the measured target, it is possible to increase the measurement accuracy and to enhance the control accuracy of the semiconductor element 40 comparing to acquiring the electric current from the terminal 41 via a lead line, for example.

Figure 6:
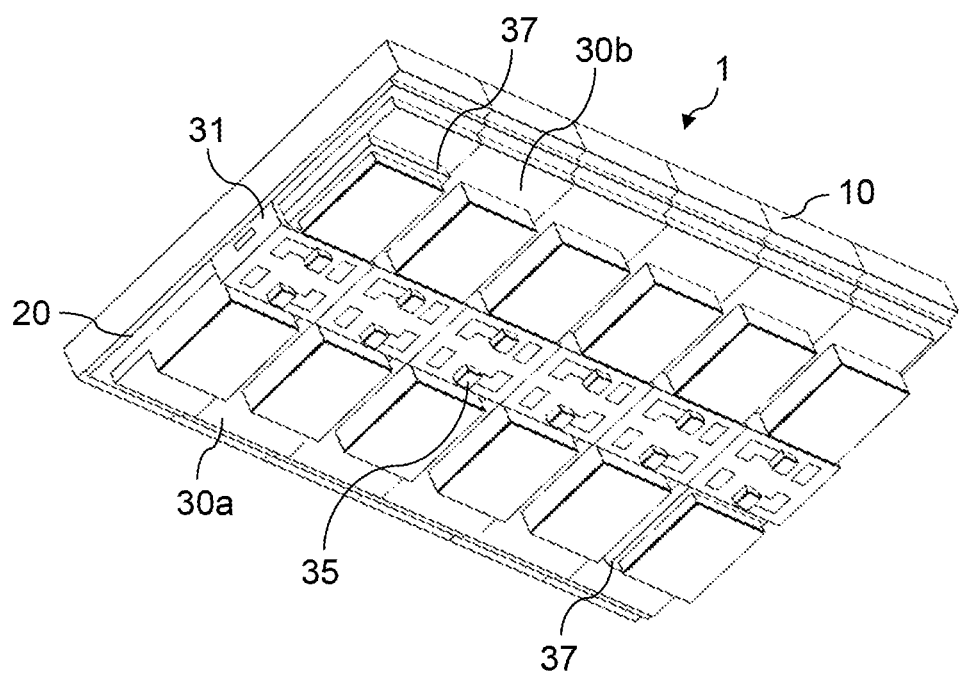
FIG. 6 is a perspective view illustrating an implementation example of a coil 37.

FIG. 6 is a perspective view illustrating an implementation example of the coil 37. It is not always necessary to provide the coil 37 for each of the semiconductor elements 40. The coil 37 may be provided only for a part of the semiconductor elements 40. FIG. 6 shows an example where the coil 37 is provided at two semiconductor elements 40 positioned diagonally to each other. By increasing the distance between the coils 37, it is possible to suppress the interference between the coils 37 and to keep the measurement accuracy.

Embodiment 3

Figure 7:
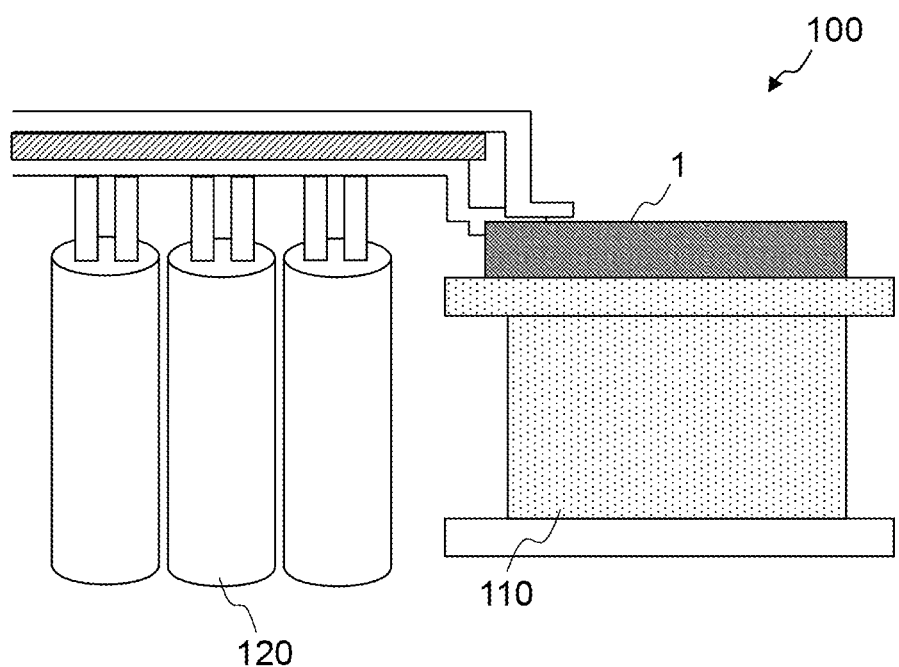
FIG. 7 is a diagram illustrating a configuration of a unit cell portion of an electric power converter 100 according to an embodiment 3.

FIG. 7 is a diagram illustrating a configuration of a unit cell portion of an electric power converter 100 according to an embodiment 3 of this disclosure. The electric power converter 100 is a device such as an inverter, a converter, or a power conditioner, for example. The electric power converter 100 includes the insulating substrate 1 of FIG. 4 described in any one of the embodiments 1-2, a heat dissipating fin 110, and a smoothing condenser 120. The semiconductor element 40 implemented in the insulating substrate 1 of FIG. 4 is, for example, an element that converts direct current electric power into alternating current electric power using switching devices. By using the insulating substrate 1 according to the embodiments 1-2, it is possible to improve the conversion efficiency of the electric power converter 100.

<Modification of this Disclosure>

The invention is not limited to the above-mentioned embodiments and includes various modified examples. For example, the above-mentioned embodiments have described in detail for the purpose of easy understanding of the invention, and all the elements described therein do not have to be included.

In the embodiments above, an example is shown where the metal oxide for forming the resistance layer 36 is $RuO_2$. Alternatively, other metal oxides may be employed. For example, $IrO_2$ or $RhO_2$ may be employed. Further, a mixture of Ag/Pd may be employed. In addition to above, gold, platinum, palladium, silver, or copper may be mixed to be employed. When forming the resistance layer 36, a paste in which (a) these metal oxides or metal powders, (b) additives such as $CuO$, $V_2O_5$, $MnO_2$, $TiO_2$, and (c) glass are mixed is printed as a part of the control signal input circuit 31, and then is sintered along with the insulating layer 20.

In the embodiments above, silicon nitride ceramics may be used as a material for the insulating layer 20, for example. As a material for the control signal input circuit 31, a material may be employed that is a thermally expanding ceramics which thermal expansion coefficient is closer to that of the insulating layer 20 and that can be bonded to the insulating layer 20. The thermal expansion coefficient α of silicon nitride ceramics substrate is approximately 3 (ppm/K). Thus a material may be employed for the control signal input circuit 31 which thermal expansion coefficient α is approximately at or below 10 (ppm/K).

The embodiments above describe laser processing as a method for adjusting the resistance of the resistance layer 36. Other methods may be employed for adjusting the resistance. For example, the combination of materials may be adjusted. For example, for the resistance layer 36, a material may be employed such as (a) $RuO_2$ only, (b) a mixture of silicon nitride and $RuO_2$, (c) adding silver in addition to (a) (b). It is possible to adjust the resistance of the resistance layer 36 by modifying combination or composition of the material. Further, by adjusting the size or resistivity of the resistance layer 36, a desired resistance may be implemented.

In the embodiments above, an example is shown where the semiconductor element 40 is implemented on the insulating substrate 1. When implementing circuit elements other than the semiconductor element 40 on the insulating substrate 1, it is possible to align the gate resistance with respect to such circuit elements to improve the operational accuracy, by employing the configuration according to this disclosure.

In the embodiments above, the electric power converter 100 is shown as an example of device comprising the insulating substrate 1. By employing the insulating substrate 1 according to this disclosure in other types of semiconductor devices, it is possible to improve operational efficiency of the semiconductor element 40.

REFERENCE SIGNS LIST

1: insulating substrate
10: heat dissipation layer
20: insulating layer
30: wire layer
30a, 30b: wire layer
31: control signal input circuit
31a: control signal input circuit
32: wire
32a: wire
33: bonding wire
34: resistor
35: connection terminal
36: resistance layer
37: coil
40: semiconductor element
41: terminal
42: gate terminal
100: electric power converter
110: heat dissipating fin
120: smoothing condenser

The invention claimed is:

1. An insulating substrate comprising:
a heat dissipation layer;
a wire layer;
a wire formed within the wire layer that is connected to a first semiconductor and a second semiconductor;
an insulating layer formed between the wire layer and the heat dissipation layer that electrically insulates the wire layer from the heat dissipation layer;
and
a resistance layer that is integrally formed with the wire from a paste including $RuO_2$ and a glass powder, wherein a width and length of the resistance layer are adjusted to provide an equal resistance to an input gate of the first semiconductor and the second semiconductor.

2. The insulating substrate according to claim 1, further comprising:
a control signal circuit layer that propagates a control signal to the first semiconductor and the second semiconductor.

3. The insulating substrate according to claim 1,
wherein the wire is formed from a second paste that includes a second glass powder and at least one of Cu or Ag.

4. The insulating substrate according to claim 2,
wherein a difference between an input resistance of the input gate of the first semiconductor and an the input resistance of the input gate of the second semiconductor is smaller than a difference between resistances of portions of signal wires forming a signal propagation path of the control signal circuit layer excluding the resistance layer.

5. The insulating substrate according to claim 1,
wherein the first semiconductor or the second semiconductor include an electric power terminal that outputs electric power, and
wherein the insulating substrate further comprises:
a coil is formed at a part of the wire layer, the coil being disposed to surround the electric power terminal.

6. The insulating substrate according to claim 1,
wherein the first semiconductor and the second semiconductor are electrically connected in parallel.

7. The insulating substrate according to claim 1,
wherein the insulating layer is formed from a ceramics material.

8. The insulating substrate according to claim 1, wherein the length and the width of the resistance layer are adjusted by laser processing.

9. The insulating substrate according to claim 1, further comprising:
a covering layer that covers the wire and the resistance layer, wherein the covering layer is formed by placing a second glass powder paste on the substrate and sintering the substrate.

10. The insulating substrate according to claim 1, wherein the resistance layer is further formed from at least one of $CuO$, $V_2O_5$, $MnO_2$, and $TiO_2$.

11. The insulating substrate according to claim 1, wherein the glass powder includes a silicon nitride.

* * * * *